(12) United States Patent
Seo

(10) Patent No.: US 6,949,428 B2
(45) Date of Patent: Sep. 27, 2005

(54) METHOD FOR FABRICATING CAPACITOR OF SEMICONDUCTOR DEVICE

(75) Inventor: Won Sun Seo, Kyoungki-do (KR)

(73) Assignee: Hynix Semicondutor Inc., Kyoungki-do (KR)

( * ) Notice: Subject to any disclaimer, the term of this patent is extended or adjusted under 35 U.S.C. 154(b) by 98 days.

(21) Appl. No.: 10/738,409

(22) Filed: Dec. 17, 2003

(65) Prior Publication Data

US 2004/0214402 A1 Oct. 28, 2004

(30) Foreign Application Priority Data

Apr. 23, 2003 (KR) .............................. 10-2003-0025778

(51) Int. Cl.[7] ......................................... H01L 21/8242
(52) U.S. Cl. ..................................... 438/253; 438/653
(58) Field of Search ................................. 438/253, 256, 438/396, 399, 595, 653

(56) References Cited

U.S. PATENT DOCUMENTS 6,284,595 B1 * 9/2001 Kato ........................... 438/253
6,380,574 B1 * 4/2002 Torii et al. ................... 257/295
6,607,954 B2 * 8/2003 Jeon et al. ................... 438/253
6,727,542 B2 * 4/2004 Kim et al. ................... 257/306

* cited by examiner

Primary Examiner—Chandra Chaudhari
(74) Attorney, Agent, or Firm—Ladas & Parry LLP

(57) ABSTRACT

In fabricating a capacitor of a semiconductor device, a first contact plug is formed in a plug contact hole formed by patterning a portion of a first interlayer insulating film formed on a substrate. A first barrier layer, a first polysilicon layer, and a second barrier layer are formed. A first contact hole is formed after sequentially patterning the second barrier layer, the first polysilicon layer, and the first barrier layer. A first dielectric layer is formed to have portions located at outside and bottom parts of the first contact hole. A second polysilicon layer is formed to have its portions located at portions except for the first contact hole. A second dielectric layer and a third polysilicon layer are formed. A second interlayer insulating film is formed after patterning the third polysilicon layer. The second interlayer insulating film, the patterned third polysilicon layer, the second dielectric layer, the second barrier layer, and the first polysilicon layer are selectively removed to form a second contact hole and a second contact plug, and then forming a metal wiring.

9 Claims, 12 Drawing Sheets

2

METHOD FOR FABRICATING CAPACITOR OF SEMICONDUCTOR DEVICE

BACKGROUND OF THE INVENTION

1. Field of the Invention

The present invention relates to a method for fabricating a capacitor of a semiconductor device, and more particularly to a method for fabricating a capacitor which can secure a capacitance suitable for a high-integrated semiconductor device and also can improve the safety of a pattern.

2. Description of the Prior Art

According to the advance of high integration of the semiconductor device, capacitors fabricated in a cylinder shape by the conventional process have a limitation of capacitance security.

As a cell pitch is reduced, the sectional area of a capacitor is reduced, and thus the height of the capacitor must be increased more and more in order to compensate for the reduced sectional area.

However, with the consideration of pattern formation, even the increase of the height has a limitation. Also, it has been difficult to prevent the inclination of a storage nodes when a cylinder shape is formed.

Hereinafter, a method for fabricating a capacitor of a semiconductor having such problems, according to the prior art, will be described with reference to FIGS. 1A to 1H.

FIGS. 1A to 1H are cross-sectional views showing each process of a method for fabricating a capacitor of a semiconductor device according to the prior art.

As shown in FIG. 1A, with a method for fabricating a capacitor of a semiconductor device according to the prior art, bit lines 13 and a hard-mask layer 15 are formed on a semiconductor substrate 11 having a device isolation film and word lines, and then an interlayer insulating film 17 is deposited on the upper surface of the resultant lamination obtained through the above process.

Then, after portions of the interlayer insulating film 17 are selectively removed to form plug contact holes 19 which exposes portions of the semiconductor substrate 11 between the bit lines 13, contact plugs 21 are formed in the plug contact holes 19.

Subsequently, a first nitride film 23 for an etching barrier is deposited on the upper surface of the resultant lamination obtained through the above process, and then a first interlayer oxide film 25 is deposited on the first nitride film 23.

Next, as shown in FIG. 1B, a mask pattern (not shown) for defining a storage node formation region is formed on the first interlayer oxide film 25, and then the first interlayer oxide film 25 and the first nitride film 23 are sequentially removed using the mask pattern (not shown) as a mask, and thereby storage node contact holes 27 are formed.

Subsequently, as shown in FIG. 1C, the mask pattern (not shown) is removed, and then a polysilicon layer 29 for storage nodes is deposited on the surface the resultant lamination including the storage node contact holes 27.

Next, a second interlayer oxide film 31 is deposited on the polysilicon layer 29 for storage nodes with a thickness enough to fill the storage node contact holes 27, and chemical mechanical polishing (CMP) is performed to separate and flatten the second interlayer oxide film 31.

Subsequently, as shown in FIG. 1D, the first interlayer oxide film 25 and the second interlayer oxide film 31 are removed to form storage node electrodes 29a of a cylinder shape. At this time, as shown at "A" in FIG. 1E, a bridge is formed between the storage node electrodes 29a of a cylinder shape due to an inclination problem caused when the storage node electrodes 29a are formed.

Next, as shown in FIG. 1F, a dielectric film 33 is deposited on the surface of the storage node electrodes 29a.

Subsequently, as shown in FIG. 1G, a polysilicon layer for a plate is deposited on the dielectric film 33, and then this polysilicon layer is flattened to form a plate electrode 35 of a capacitor.

Subsequently, as shown in FIG. 1H, another interlayer insulating film 39 is additionally deposited on an interlayer insulating film 37 including the plate electrode 35, and then the interlayer insulating film 39 is selectively removed to form wiring contact holes 41 which expose the plate electrode 35.

Next, wiring plugs 43 electrically connected with the exposed plate electrode 35 are formed in the wiring contact holes 41, and then a metal wiring 45 is formed on the wiring plugs 43.

In the conventional method described above, when storage node electrodes of a cylinder shape as shown in FIG. 1D are formed by removing an interlayer oxide film, it is either impossible to employ metastable polysilicon (hereinafter, referred to as "MPS") or inevitable to use the MPS only inside of the cylinder, in consideration of step coverage of dielectric materials as well as possible break of the storage node electrodes, shortage problem of a lower area, etc.

Also, as shown in FIG. 1C, when storage node electrodes of a cylinder shape are formed, a bridge can be formed due to inclination of the pattern.

SUMMARY OF THE INVENTION

Accordingly, the present invention has been made to solve the above-mentioned problems occurring in the prior art, and an object of the present invention is to provide a method for fabricating a capacitor of a semiconductor device, which can fundamentally provide the pattern from breaking, inclining, etc., when a capacitor of a cylinder shape is formed, so that the pattern can be stably formed and also both inside and outside of the each storage node electrode can contribute to increasing the capacitance of a capacitor.

In order to accomplish this object, there is provided a method for fabricating a capacitor of a semiconductor device, the method comprising the steps of: (1) forming a first interlayer insulating film on a semiconductor substrate, and then selectively removing the first interlayer insulating film to form a plug contact hole; (2) forming a first contact plug in the plug contact hole; (3) forming a first barrier layer on an upper surface of a first resultant lamination including the first contact plug, the first resultant lamination having been obtained through steps (1) and (2); (4) forming a first polysilicon layer and a second barrier layer on the first barrier layer; (5) sequentially patterning the second barrier layer, the first polysilicon layer, and the first barrier layer, thereby forming a first contact hole which exposes an upper surface of the contact plug; (6) forming a first dielectric layer on an upper surface of a second resultant lamination including the first contact hole, the second resultant lamination having been obtained through steps (1) to (5); (7) removing portions of the first dielectric layer, which are located at outside and bottom parts of the first contact hole, thereby leaving a portion of the first dielectric layer located at one side portion of the first contact hole; (8) forming a second polysilicon layer on an upper surface of a third resultant lamination, which has been obtained through steps (1) to (7)

and includes the first dielectric layer remaining on said one side portion of the first contact hole, and then removing the second polysilicon layer located at portions except for the first contact hole; (9) forming a second dielectric layer on an upper surface of a fourth resultant lamination obtained through steps (1) to (8), forming a third polysilicon layer on the second dielectric layer, and patterning the third polysilicon layer; (10) forming a second interlayer insulating film on an upper surface of a fifth resultant lamination obtained through steps (1) to (9), and selectively removing the second interlayer insulating film, the patterned third polysilicon layer, the second dielectric layer, the second barrier layer, and the first polysilicon layer, thereby forming a second contact hole; and (11) forming a second contact plug in the second contact hole, and then forming a metal wiring on the second contact plug and the second interlayer insulating layer.

In accordance with another aspect of the present invention, there is provided a method for fabricating a capacitor of a semiconductor device, the method comprising the steps of: (1) forming a first interlayer insulating film on a semiconductor substrate, selectively removing the first interlayer insulating film to form a plug contact hole, and forming a first contact plug in the plug contact hole; (2) forming a first barrier layer on an upper surface of a first resultant lamination including the first contact plug, the first resultant lamination having been obtained through step (1); (3) forming a first polysilicon layer and a second barrier layer on the first barrier layer; (4) forming a second interlayer insulating film on the second barrier layer; (5) selectively removing the second barrier layer, the second barrier layer, the first polysilicon layer, and the first barrier layer, thereby forming a first contact hole; (6) forming a first dielectric layer on an upper surface of a second resultant lamination including the first contact hole, the second resultant lamination having been obtained through steps (1) to (5); (7) removing portions of the first dielectric layer, which are located at outside and bottom parts of the first contact hole, thereby leaving a portion of the first dielectric layer located at one side portion of the first contact hole; (8) forming a second polysilicon layer on an upper surface of a third resultant lamination, which has been obtained through steps (1) to (7) and includes the first dielectric layer remaining on said one side portion of the first contact hole, and then removing the second polysilicon layer located at portions except for the first contact hole; (9) forming a second dielectric layer on an upper surface of a fourth resultant lamination obtained through steps (1) to (8), forming a third polysilicon layer on the second dielectric layer, and patterning the third polysilicon layer; (10) forming a third interlayer insulating film on an upper surface of a fifth resultant lamination obtained through steps (1) to (9), and selectively removing the third interlayer insulating film, the patterned third polysilicon layer, the second dielectric layer, the second interlayer insulating film, the second barrier layer, and the first polysilicon layer, thereby forming a second contact hole; and (11) forming a second contact plug in the second contact hole, and then forming a metal wiring on the second contact plug and the third interlayer insulating layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
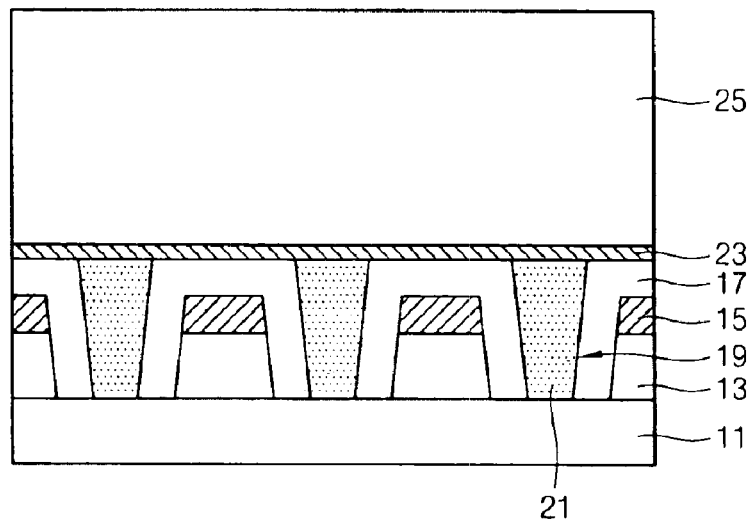
FIGS. 1A to 1H are cross-sectional views showing each process of a method for fabricating a capacitor of a semiconductor device according to the prior art.
Figure 1B:
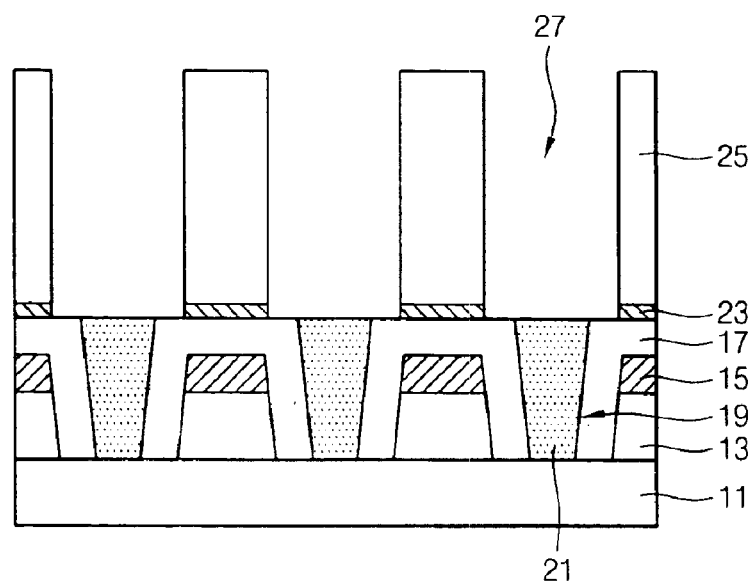
Figure 1C:
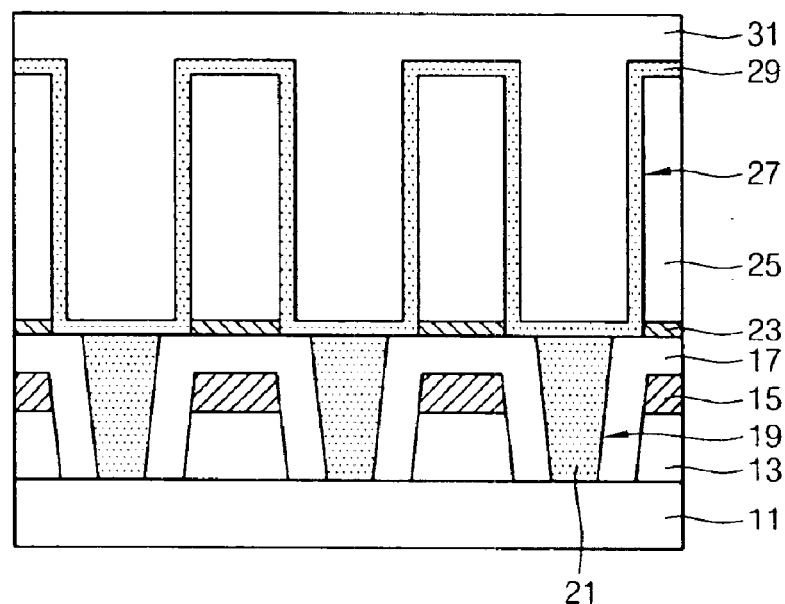
Figure 1D:
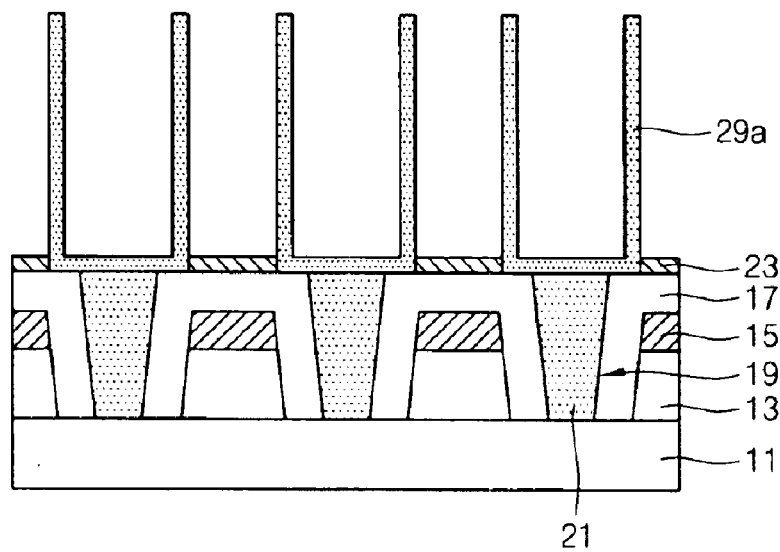
Figure 1E:
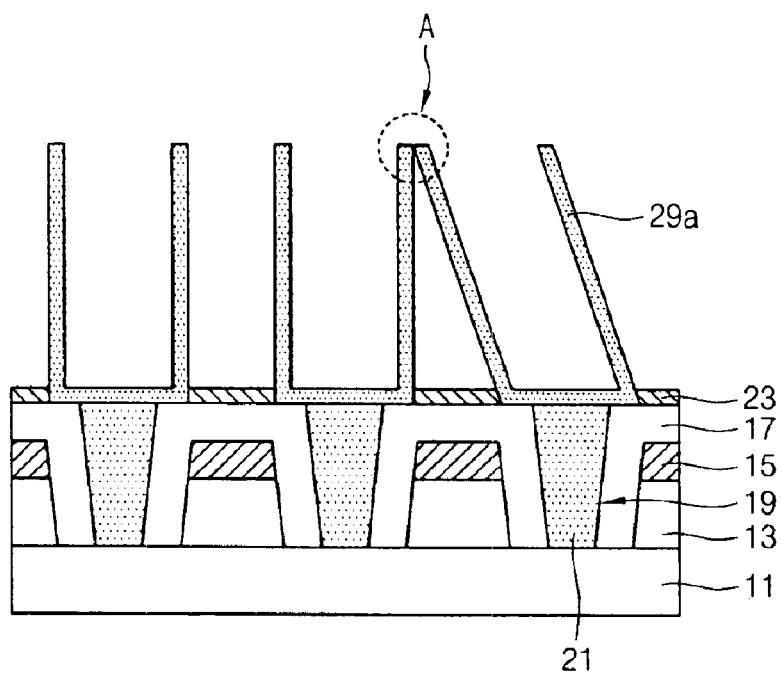
Figure 1F:
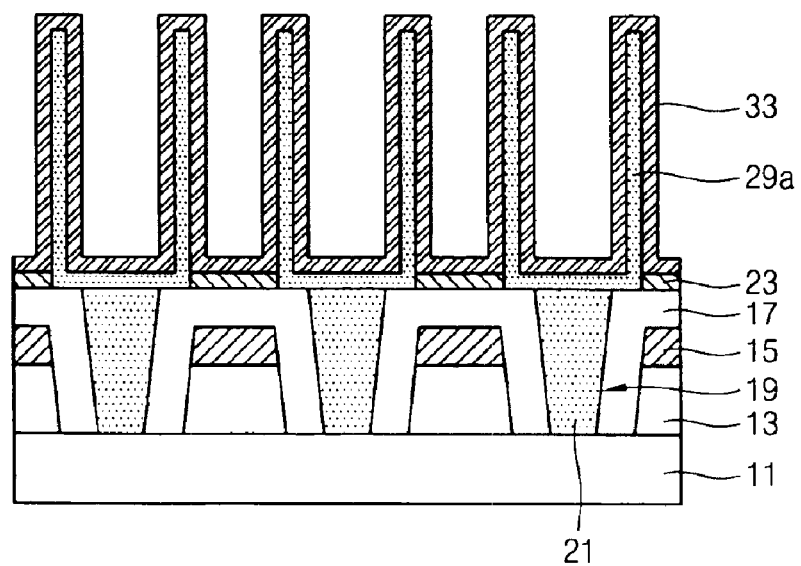
Figure 1G:
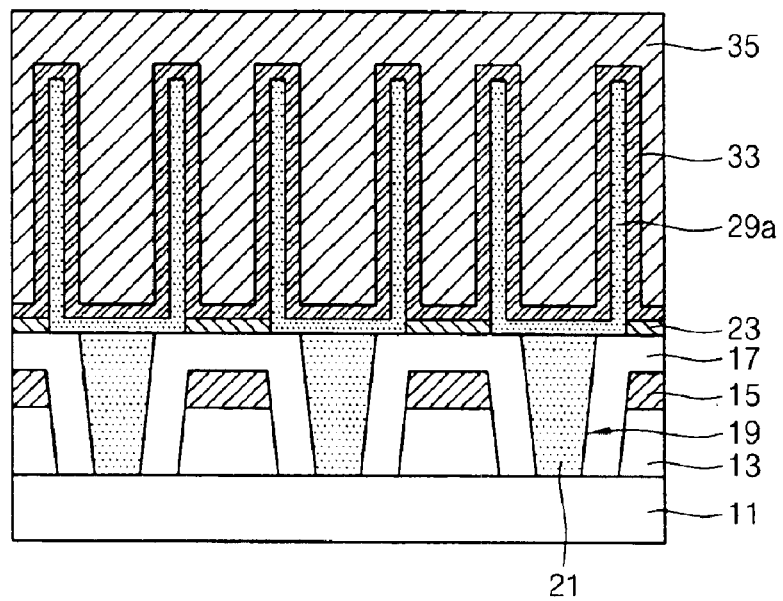
Figure 1H:
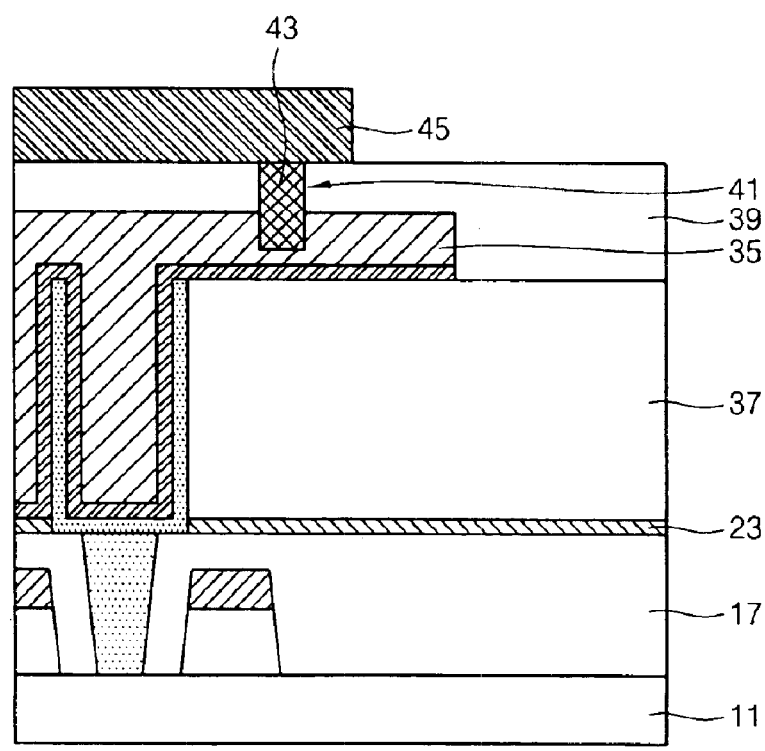

Hereinafter, preferred embodiments of the present invention will be described with reference to the accompanying drawings. In the following description and drawings, the same reference numerals are used to designate the same or similar components, and so repetition of the description on the same or similar components will be omitted.

FIGS. 2A to 2H are cross-sectional views showing each process of a method for fabricating a capacitor of a semiconductor device according to an embodiment of the present invention.

Figure 2A:
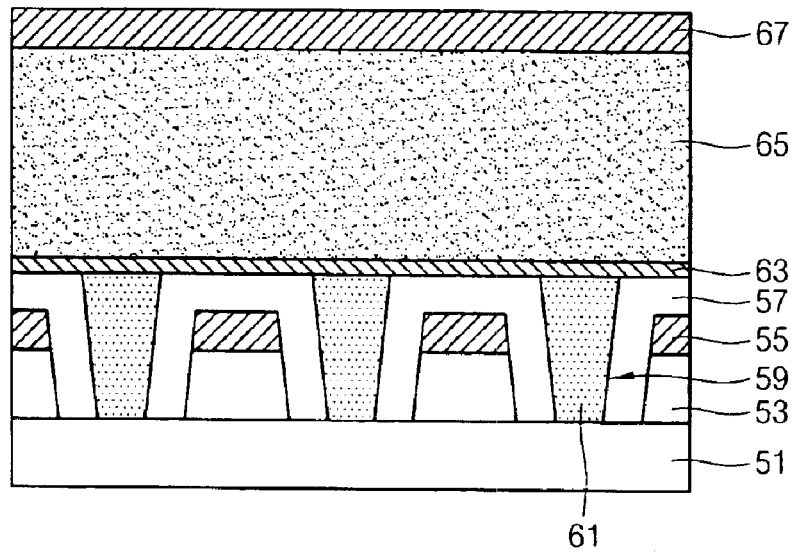
FIGS. 2A to 2H are cross-sectional views showing each process of a method for fabricating a capacitor of a semiconductor device according to an embodiment of the present invention.

With a method for fabricating a capacitor of a semiconductor device according to a preferred embodiment of the present invention, as shown in FIG. 2A, bit lines 53 and a hard-mask layer 55 are formed on a semiconductor substrate 51 having a device isolation film and word lines, and then an interlayer insulating film 57 is deposited on the upper surface of the resultant lamination obtained through the above process.

Then, after portions of the interlayer insulating film 57 are selectively removed to form plug contact holes 59 which exposes portions of the semiconductor substrate 51 between the bit lines 53, contact plugs 61 are formed in the plug contact holes 59.

Subsequently, a first nitride film 63 for an etching barrier is deposited on the upper surface of the resultant lamination obtained through the above process, and then a first polysilicon layer 65 and a second nitride film 67 are sequentially deposited on the first nitride film 63.

Figure 2B:
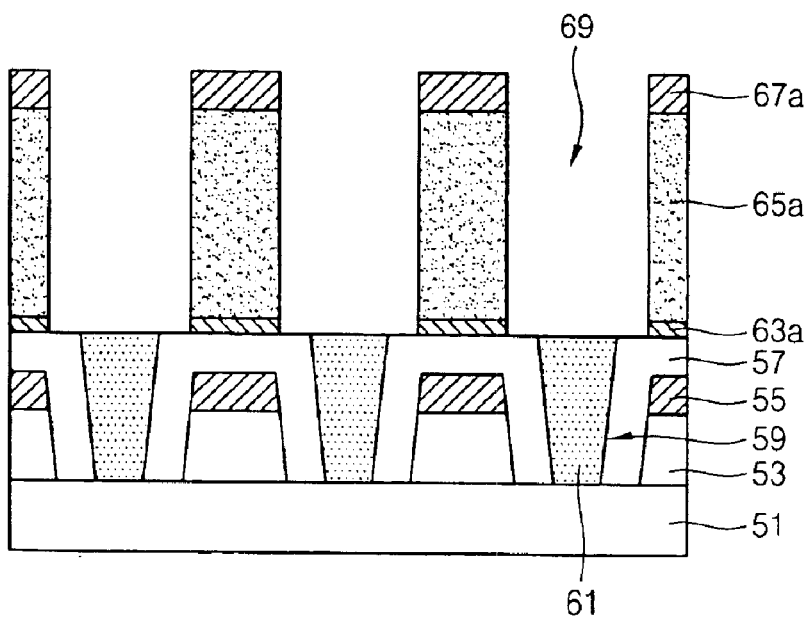

Next, as shown in FIG. 2B, a mask pattern (not shown) for defining a storage node formation region is formed on the second nitride film 67, and then the second nitride film 67, the first polysilicon layer 65, and the first nitride film 63 are sequentially removed using the mask pattern as a mask, and thereby storage node contact holes 69 exposing an upper surface of the contact plugs 61 are formed.

Figure 2C:
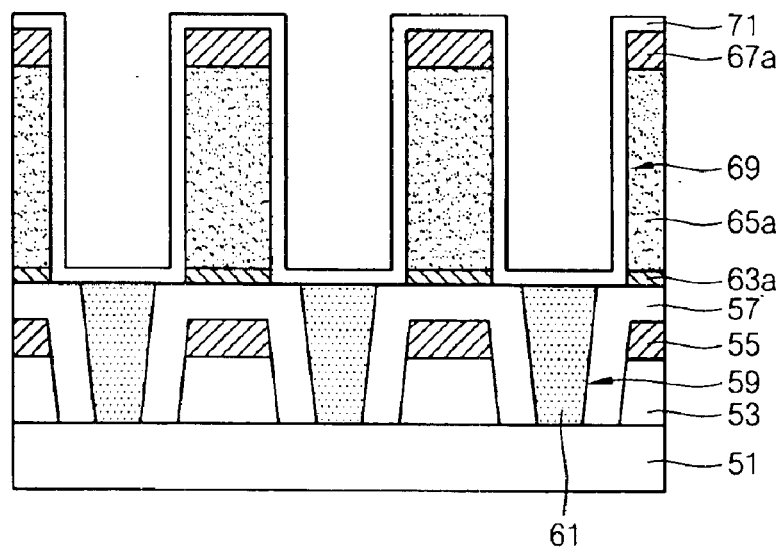

Subsequently, as shown in FIG. 2C, the mask pattern (not shown) is removed, and then a first dielectric film 71 is deposited on the surface the resultant lamination including the storage node contact holes 69. Before the first dielectric film 71 is deposited, MPS (not shown) is grown on the outer surface of the pattern so as to secure an area. Here, the thickness of an outer polysilicon is adjusted so that the pattern is not affected when the MPS is grown.

Figure 2D:
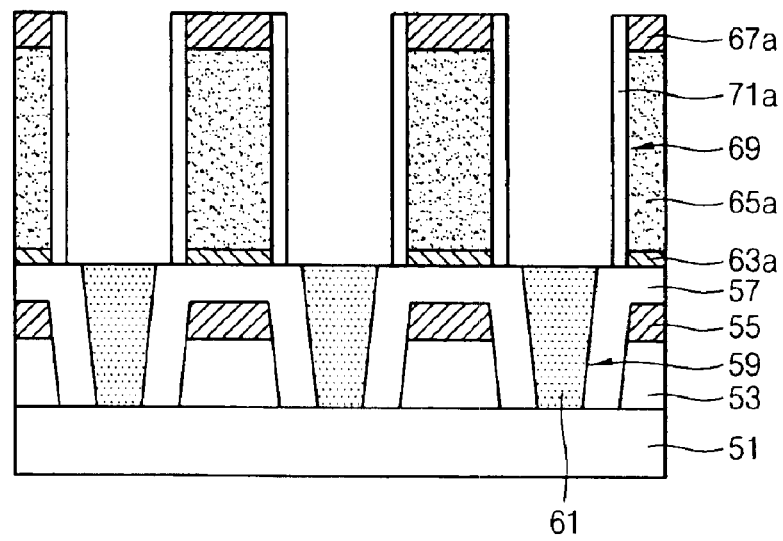

Next, as shown in FIG. 2D, portions of the first dielectric film 71, which are located on the second nitride film pattern 67a and in the bottom part of the storage node contact holes 69, are removed by an anisotropic dry etching process, and thereby the surface of the contact plugs 61 are exposed to the outside.

Figure 2E:
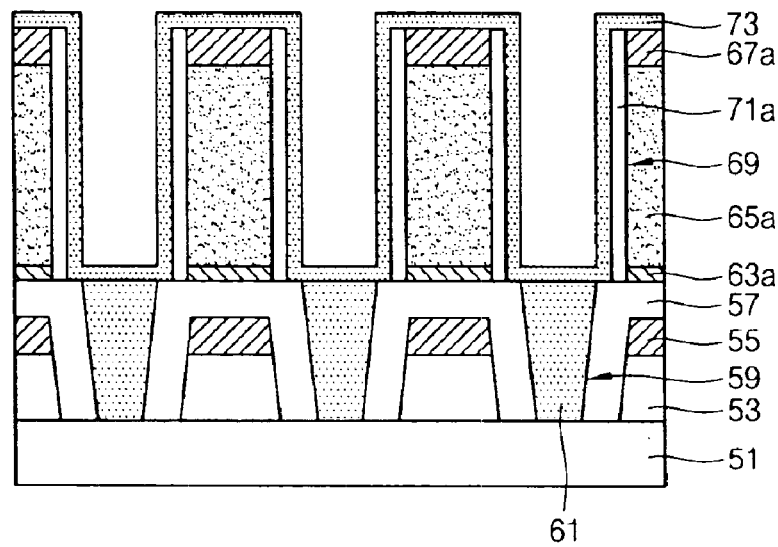

Subsequently, as shown in FIG. 2E, a polysilicon layer 73 for a storage node is deposited on the upper surface of the resultant lamination obtained through the above process, and then a sacrificing insulation film (not shown) is deposited on the polysilicon layer 73 at a thickness sufficient to fill the storage node contact holes.

Figure 2F:
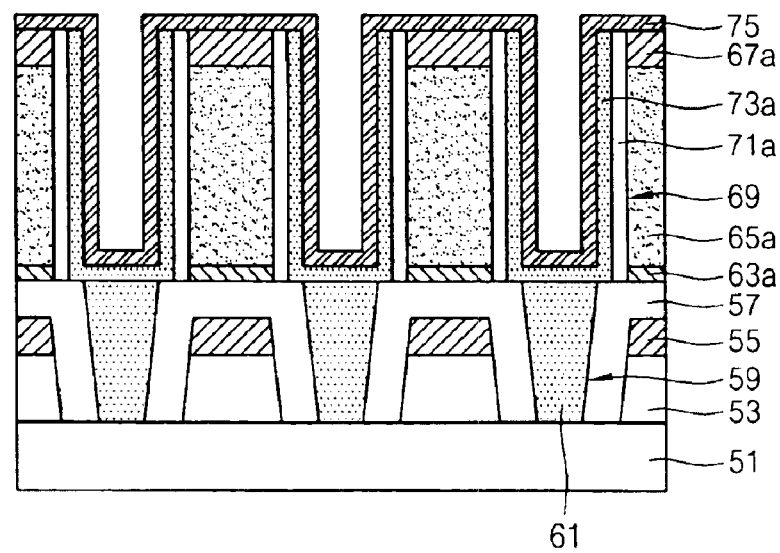

Next, as shown in FIG. 2F, the sacrificing insulation film (not shown) and the polysilicon layer 73 for a storage node are selectively removed by an etching process to the entire surface or by a chemical mechanical polishing (CMP) process, and then a remaining sacrificing insulation film (not shown) is removed to separate the storage node electrodes 73a from each other. Subsequently, a second dielectric film 75 is deposited on the surface of the resultant lamination obtained through the above process. Here, before the second dielectric film 75 is deposited, a MTS structure (not shown) may be grown on the surface of the storage node electrics 73a so as to secure an area for a capacitor.

Figure 2G:
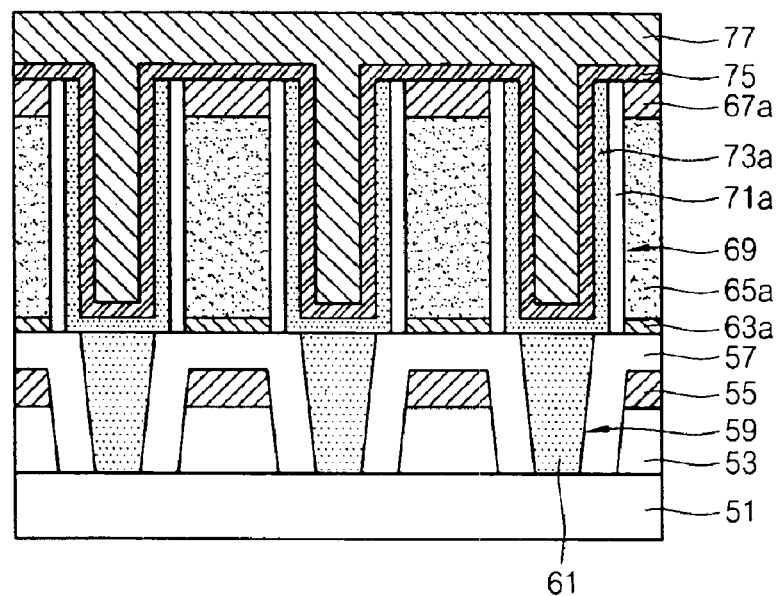

Subsequently, as shown in FIG. 2G, a polysilicon layer 77 for an upper electrode is deposited on the second dielectric film 75.

Figure 2H:
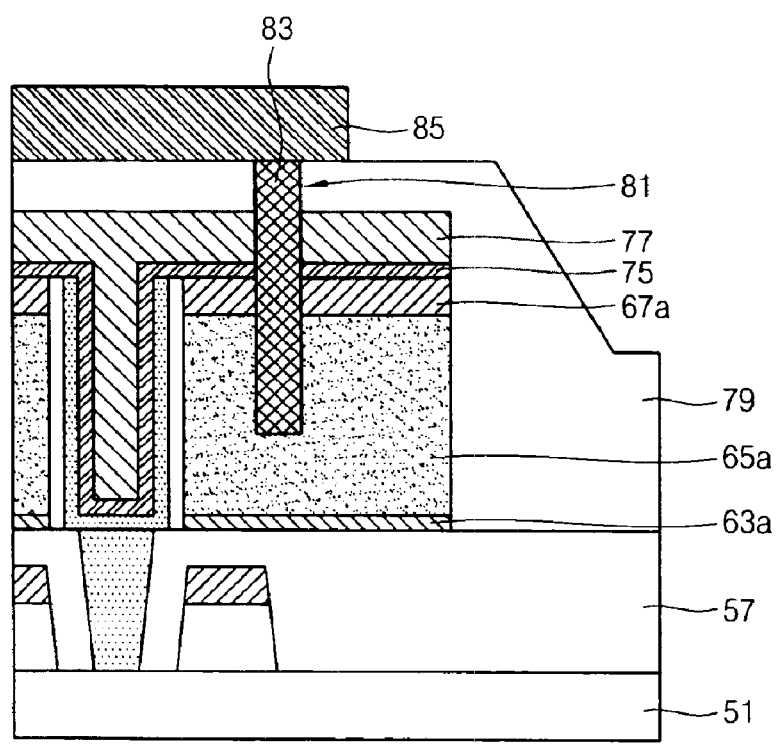

Next, as shown in FIG. 2H, an interlayer insulating film 79 is deposited on an upper surface of the resultant lamination including the polysilicon layer 77 for an upper electrode. Then, the interlayer insulating film 79, the polysilicon layer 77, the second dielectric film 75, the second nitride film pattern 67a, and the first polysilicon layer 65 are selectively removed to form metal wiring contact holes 81. In this case, when the metal wiring contact holes are formed, even a portion above the first nitride film for a storage node etching barrier can be etched, so that contact can be easily formed.

Subsequently, plugs 83 are formed in the metal wiring contact holes 81, and then a metal wiring 85 is formed on the plugs 83 and the interlayer insulating film 79.

Hereinafter, a method for fabricating a capacitor of a semiconductor device according to another embodiment of the present invention will be described with reference to FIGS. 3A to 3H.

Figure 3A:
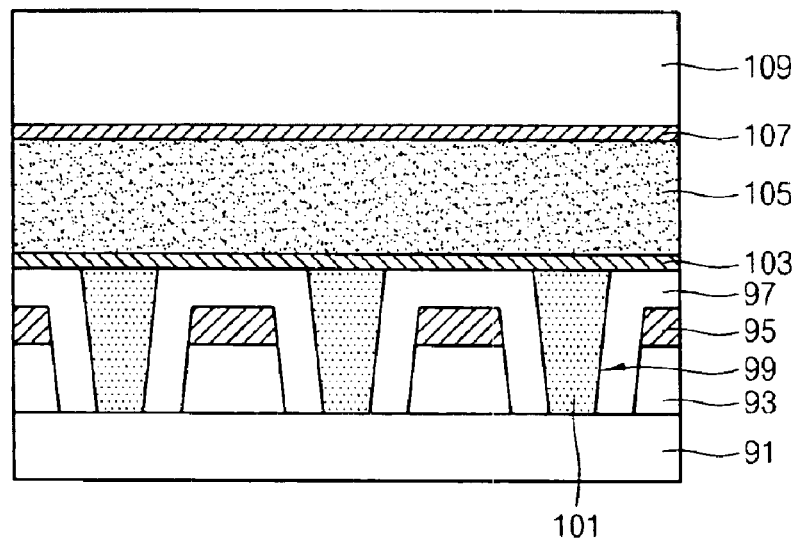
FIGS. 3A to 3H are cross-sectional views showing each process of a method for fabricating a capacitor of a semiconductor device according to another embodiment of the present invention.

First of all, as shown in FIG. 3A, bit lines 93 and a hard-mask layer 95 are formed on a semiconductor substrate 91 having a device isolation film and word lines, and then an interlayer insulating film 97 is deposited on the upper surface of the resultant lamination obtained through the above process.

Then, after portions of the interlayer insulating film 97 are selectively removed to form plug contact holes 99 which exposes portions of the semiconductor substrate 91 between the bit lines 93, contact plugs 101 are formed in the plug contact holes 99.

Subsequently, a first nitride film 103 for an etching barrier is deposited on the upper surface of the resultant lamination obtained through the above process, and then a first polysilicon layer 105, a second nitride film 107, and a storage node oxide film 109 are sequentially deposited on the first nitride film 103.

Figure 3B:
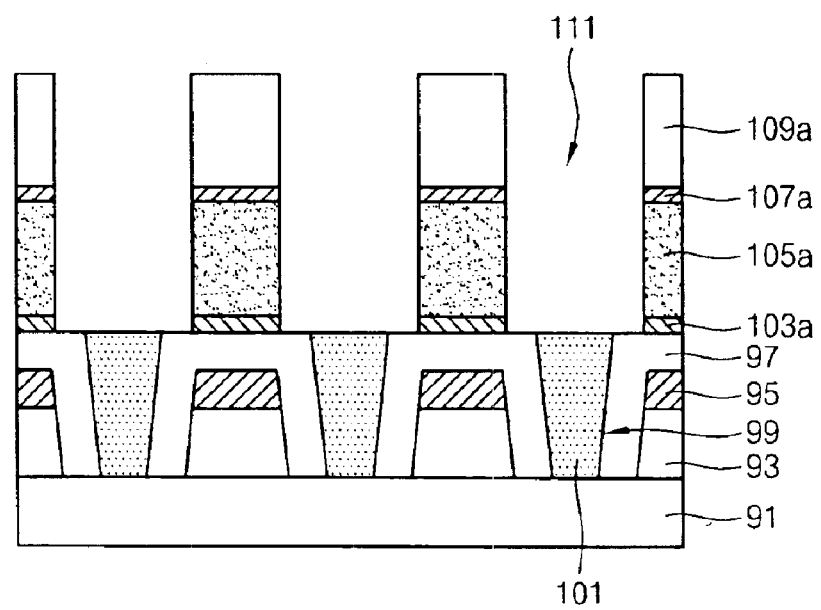

Next, as shown in FIG. 3B, a mask pattern (not shown) for defining a storage node formation region is formed on the storage node oxide film 109, and then the storage node oxide film 109, the second nitride film 107, the first polysilicon layer 105, and the first nitride film 103 are sequentially removed using the mask pattern as a mask, and thereby storage node contact holes 111 exposing an upper surface of the contact plugs 101 are formed.

Figure 3C:
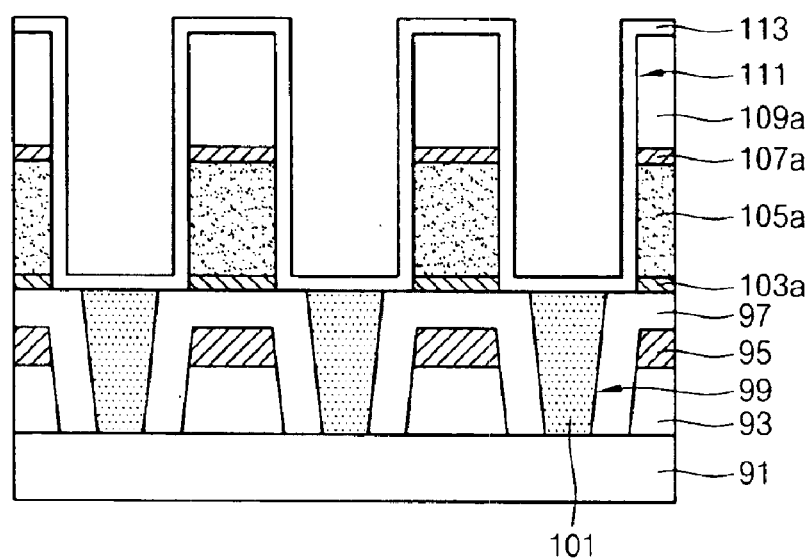

Subsequently, as shown in FIG. 3C, the mask pattern (not shown) is removed, and then a first dielectric film 113 is deposited on the surface the resultant lamination including the storage node contact holes 111. Before the first dielectric film 113 is deposited, MPS (not shown) is grown on the outer surface of the pattern so as to secure an area. Here, the thickness of an outer polysilicon is adjusted so that the pattern is not affected when the MPS is grown.

Figure 3D:
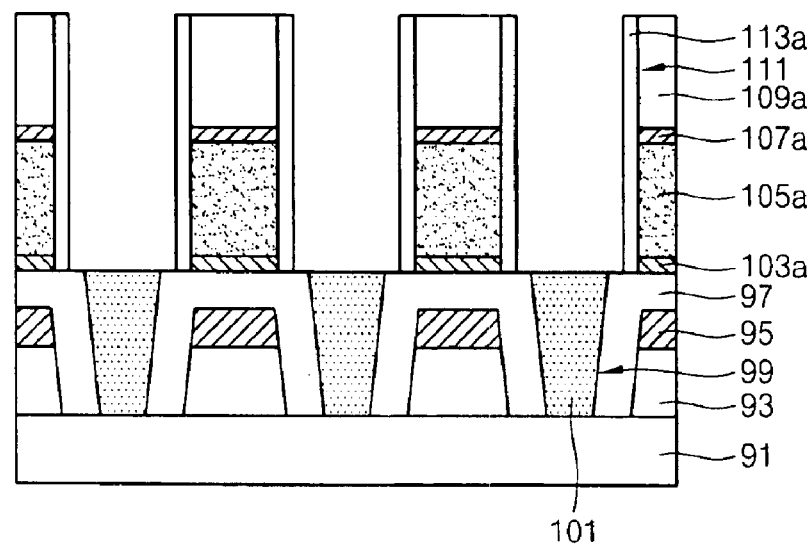

Next, as shown in FIG. 3D, portions of the first dielectric film 113, which are located on the storage node oxide film 109 and in the bottom part of the storage node contact holes 111, are removed by means of an anisotropic dry etching process, and thereby the surface of the contact plugs 101 are exposed to the outside.

Figure 3E:
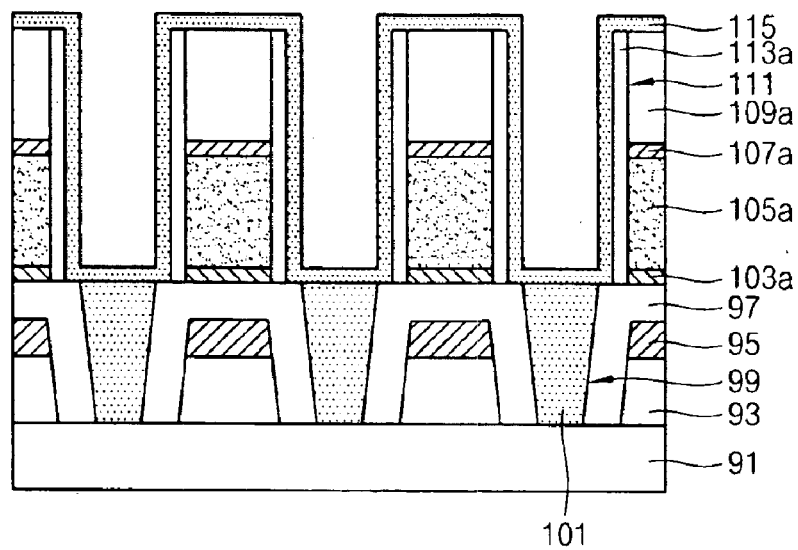

Subsequently, as shown in FIG. 3E, a polysilicon layer 115 for a storage node is deposited on the upper surface of the resultant lamination obtained through the above process.

Figure 3F:
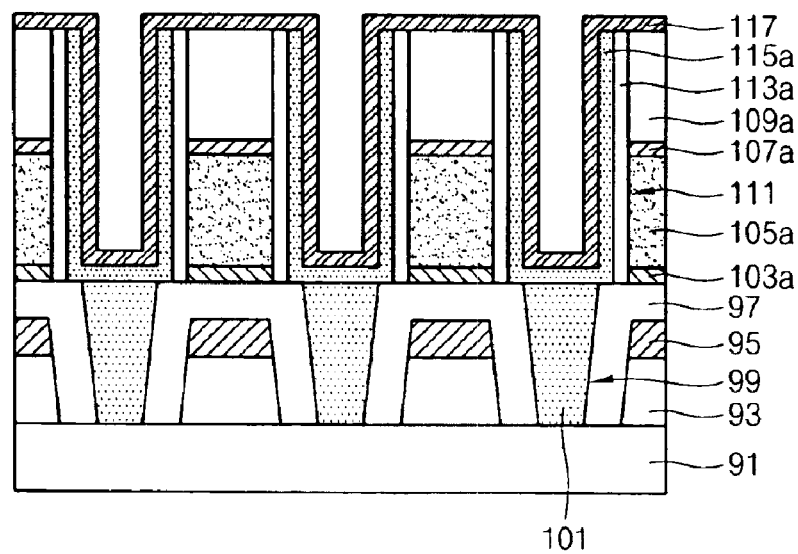

Next, as shown in FIG. 3F, a sacrificing insulation film (not shown) is deposited on the upper surface of the resultant lamination obtained through the above process at a thickness sufficient to fill the storage node contact holes.

Subsequently, the sacrificing insulation film (not shown) and the polysilicon layer 115 for a storage node are selectively removed by an etching process to the entire surface or by chemical mechanical polishing (CMP) process, and then a remaining sacrificing insulation film (not shown) is removed to separate the storage node electrodes 115a from each other. Next, a second dielectric film 117 is deposited on the surface of the resultant lamination obtained through the above process. Here, before the second dielectric film 117 is deposited, a MTS structure (not shown) may be grown on the surface of the storage node electrics 115a so as to secure an area for a capacitor.

Figure 3G:
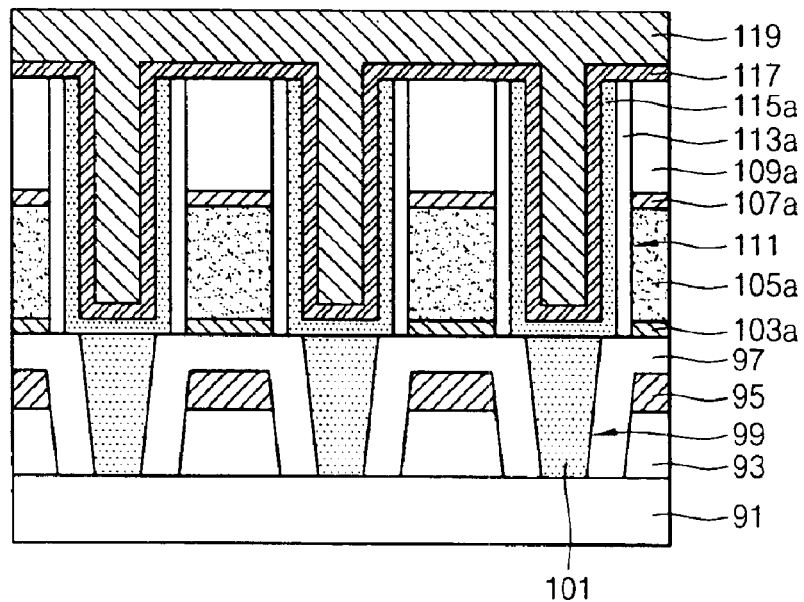

Subsequently, as shown in FIG. 3G, a polysilicon layer 119 for an upper electrode is deposited on the second dielectric film 117.

Figure 3H:
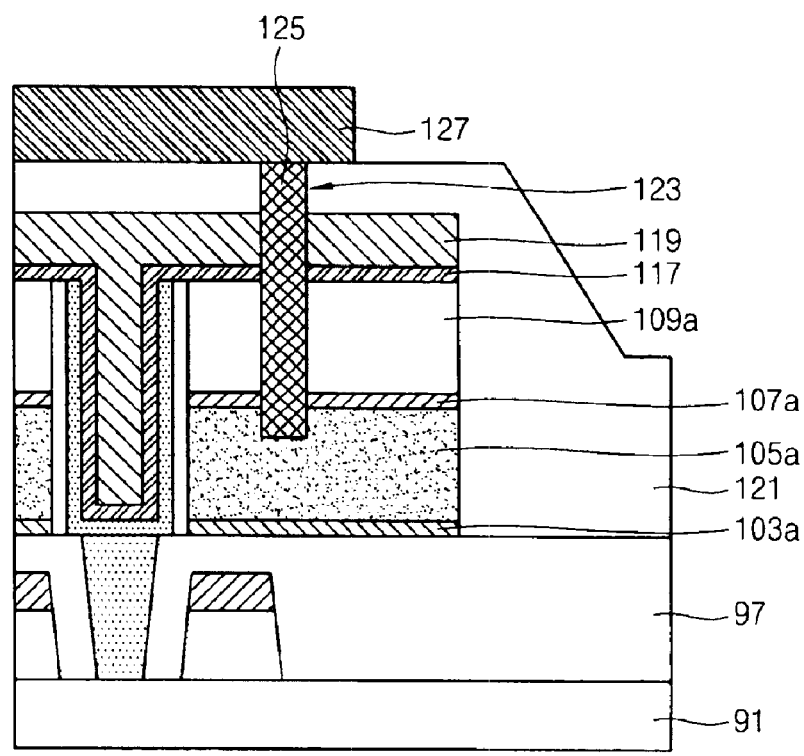

Next, as shown in FIG. 3H, an interlayer insulating film 121 is deposited on the upper surface of the resultant lamination including the polysilicon layer 119 for an upper electrode. Then, the interlayer insulating film 121, the polysilicon layer 119, the second dielectric film 117, the storage node oxide film 109, the second nitride film pattern 107a, and the first polysilicon layer 105 are sequentially removed to form metal wiring contact holes 123.

Subsequently, plugs 125 are formed in the metal wiring contact holes 123, and then a metal wiring 127 is formed on the plugs 125 and the interlayer insulating film 121. In this case, etching can be performed up to a portion above the first nitride film for a storage node etching barrier when the metal wiring contact holes are formed, so that contact can be easily formed.

As described above, with methods for fabricating a capacitor of a semiconductor device according to the present invention, a polysilicon film, instead of a storage node oxide film used in the prior art, is deposited to form a storage node pattern.

Accordingly, after the storage node pattern has formed, a polysilicon remaining out of a storage node pattern, that is, out of cylinders, is later used as an upper plate, so that the break and inclination problems of the pattern, which are caused when a cylinder-shape capacitor is formed, can be fundamentally solved.

Also, since a pattern is stably formed, capacitance of a capacitor can be secured without difficulty in both inside of outside of cylinders by growing MPS.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor of a semiconductor device, the method comprising the steps of:

(1) forming a first interlayer insulating film on a semiconductor substrate, and then selectively removing the first interlayer insulating film to form a plug contact hole;

(2) forming a first contact plug in the plug contact hole;

(3) forming a first barrier layer on an upper surface of a first resultant lamination including the first contact plug, the first resultant lamination having been obtained through steps (1) and (2);

(4) forming a first polysilicon layer and a second barrier layer on the first barrier layer;

(5) sequentially patterning the second barrier layer, the first polysilicon layer, and the first barrier layer, thereby forming a first contact hole which exposes an upper surface of the contact plug;

(6) forming a first dielectric layer on an upper surface of a second resultant lamination including the first contact hole, the second resultant lamination having been obtained through steps (1) to (5);

(7) removing portions of the first dielectric layer, which are located at outside and bottom parts of the first contact hole, thereby leaving a portion of the first dielectric layer located at one side portion of the first contact hole;

(8) forming a second polysilicon layer on an upper surface of a third resultant lamination, which has been obtained through steps (1) to (7) and includes the first dielectric layer remaining on said one side portion of the first contact hole, and then removing the second polysilicon layer located at portions except for the first contact hole;

(9) forming a second dielectric layer on an upper surface of a fourth resultant lamination obtained through steps (1) to (8), forming a third polysilicon layer on the second dielectric layer, and patterning the third polysilicon layer;

(10) forming a second interlayer insulating film on an upper surface of a fifth resultant lamination obtained through steps (1) to (9), and selectively removing the second interlayer insulating film, the patterned third polysilicon layer, the second dielectric layer, the second barrier layer, and the first polysilicon layer, thereby forming a second contact hole; and

(11) forming a second contact plug in the second contact hole, and then forming a metal wiring on the second contact plug and the second interlayer insulating layer.

2. A method for fabricating a capacitor of a semiconductor device as claimed in claim 1, wherein the third polysilicon layer and the first polysilicon layer are connected through the second contact plug.

3. A method for fabricating a capacitor of a semiconductor device as claimed in claim 1, wherein step (7) is performed through a dry-etching process.

4. A method for fabricating a capacitor of a semiconductor device as claimed in claim 1, wherein the first polysilicon layer and the third polysilicon layer are used as an upper electrode.

5. A method for fabricating a capacitor of a semiconductor device, the method comprising the steps of:

(1) forming a first interlayer insulating film on a semiconductor substrate, selectively removing the first interlayer insulating film to form a plug contact hole, and forming a first contact plug in the plug contact hole;

(2) forming a first barrier layer on an upper surface of a first resultant lamination including the first contact plug, the first resultant lamination having been obtained through step (1);

(3) forming a first polysilicon layer and a second barrier layer on the first barrier layer;

(4) forming a second interlayer insulating film on the second barrier layer;

(5) selectively removing the second barrier layer, the second barrier layer, the first polysilicon layer, and the first barrier layer, thereby forming a first contact hole;

(6) forming a first dielectric layer on an upper surface of a second resultant lamination including the first contact hole, the second resultant lamination having been obtained through steps (1) to (5);

(7) removing portions of the first dielectric layer, which are located at outside and bottom parts of the first contact hole, thereby leaving a portion of the first dielectric layer located at one side portion of the first contact hole;

(8) forming a second polysilicon layer on an upper surface of a third resultant lamination, which has been obtained through steps (1) to (7) and includes the first dielectric layer remaining on said one side portion of the first contact hole, and then removing the second polysilicon layer located at portions except for the first contact hole;

(9) forming a second dielectric layer on an upper surface of a fourth resultant lamination obtained through steps (1) to (8), forming a third polysilicon layer on the second dielectric layer, and patterning the third polysilicon layer;

(10) forming a third interlayer insulating film on an upper surface of a fifth resultant lamination obtained through steps (1) to (9), and selectively removing the third interlayer insulating film, the patterned third polysilicon layer, the second dielectric layer, the second interlayer insulating film, the second barrier layer, and the first polysilicon layer, thereby forming a second contact hole; and

(11) forming a second contact plug in the second contact hole, and then forming a metal wiring on the second contact plug and the third interlayer insulating layer.

6. A method for fabricating a capacitor of a semiconductor device as claimed in claim 5, wherein the third polysilicon layer and the first polysilicon layer are connected through the second contact plug.

7. A method for fabricating a capacitor of a semiconductor device as claimed in claim 5, wherein step (7) is performed through a dry-etching process.

8. A method for fabricating a capacitor of a semiconductor device as claimed in claim 5, wherein the first polysilicon layer and the third polysilicon layer are used as an upper electrode.

9. A method for fabricating a capacitor of a semiconductor device as claimed in claim 5, wherein the second interlayer insulating film is formed of an oxide film.

* * * * *